US012763756B2

(12) United States Patent
Vonbun et al.

(10) Patent No.: US 12,763,756 B2
(45) Date of Patent: Oct. 13, 2026

(54) DIGITAL FILTER CIRCUIT HAVING PLURAL FIR FILTER CIRCUITS BASED ON PREDEFINED FILTER PARALLELISMS

(71) Applicant: Rohde & Schwarz GmbH & Co. KG, Munich (DE)

(72) Inventors: Michael Vonbun, Munich (DE); Michael Reinhold, Munich (DE); Bernhard Nitsch, Munich (DE); Adrian Ispas, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 1350 days.

(21) Appl. No.: 17/540,729

(22) Filed: Dec. 2, 2021

(65) Prior Publication Data

US 2023/0179179 A1 Jun. 8, 2023

(51) Int. Cl.
*H03H 17/06* (2006.01)
*G01R 31/319* (2006.01)
(Continued)

(52) U.S. Cl.
CPC ....... *H03H 17/06* (2013.01); *G01R 31/31922* (2013.01); *H03H 17/0294* (2013.01); *H03H 21/0012* (2013.01)

(58) Field of Classification Search
CPC ........... H03H 17/0223; H03H 17/0225; H03H 17/0294; H03H 17/06; H03H 21/0012; H03H 2017/0247; H03H 17/0275; H03H 2218/06; H03H 2218/10; H03H 15/00; H03H 15/023; H03H 2017/0081; G01R 31/31922; G06F 9/3001; G06F 9/30014;
(Continued)

(56) References Cited

U.S. PATENT DOCUMENTS

| | | | | |
|---|---|---|---|---|
| 9,098,435 | B1 * | 8/2015 | Nelson | G06F 17/14 |
| 10,749,541 | B1 | 8/2020 | Stein et al. | |

(Continued)

FOREIGN PATENT DOCUMENTS

| | | | | |
|---|---|---|---|---|
| CN | 106936406 A | * | 7/2017 | H03H 17/06 |

OTHER PUBLICATIONS

Mou, Zhi-Jian and P. Duhamel, "Short-Length FIR Filters and Their Use in Fast Nonrecursive Filtering," IEEE Transactions on Signal Processing, 39:6; Jun. 1991, 11 pages.

(Continued)

*Primary Examiner* — James Trujillo
*Assistant Examiner* — Maria De Jesus Rivera
(74) *Attorney, Agent, or Firm* — CHRISTENSEN O'CONNOR JOHNSON KINDNESS PLLC

(57) ABSTRACT

A digital filter circuit is described. The digital filter circuit includes a digital filter input, at least two finite impulse response (FIR) filter circuits, and a connection circuit. The digital filter input is configured to receive a digital input signal set having a data parallelism. The at least two FIR filter circuits are configured to process the digital input signal set at least partially. The at least two FIR filter circuits include a pre-adder sub-circuit, a convolution sub-circuit, and a post-adder sub-circuit, respectively. The connection circuit is configured to selectively connect the at least two FIR filter circuits based on the data parallelism of the digital input signal set.

17 Claims, 7 Drawing Sheets

(51) Int. Cl.
*H03H 17/02* (2006.01)
*H03H 21/00* (2006.01)

(58) Field of Classification Search
CPC ............. G06F 9/30087; G06F 9/30112; G06F 9/30149; G06F 9/3851; G06F 9/3885; G06F 9/3893; G06F 9/3897; G06F 7/5443; G06F 17/15; G06F 8/443
See application file for complete search history.

(56) References Cited

U.S. PATENT DOCUMENTS

| | | | | |
|---|---|---|---|---|
| 11,894,821 | B2 * | 2/2024 | Skinner | H03H 17/0211 |
| 2008/0018511 | A1 * | 1/2008 | Leonard | H03H 17/0294<br>341/144 |
| 2008/0170533 | A1 * | 7/2008 | Cyzs | H04B 5/48<br>370/315 |
| 2016/0079960 | A1 | 3/2016 | Berscheid et al. | |
| 2017/0257234 | A1 | 9/2017 | Ali Shah et al. | |
| 2019/0043201 | A1 * | 2/2019 | Strong | G06V 10/96 |
| 2019/0087713 | A1 * | 3/2019 | Lamb | G06F 7/5443 |
| 2021/0014609 | A1 | 1/2021 | Ishizuka et al. | |
| 2022/0012856 | A1 * | 1/2022 | Chen | G06N 3/045 |
| 2022/0158752 | A1 | 5/2022 | Duthel et al. | |

OTHER PUBLICATIONS

Divya, B. and A. A. Jaisudhan Pazhani, "New Architecture of Parallel FIR Filter using Fast FIR Algorithm," Special Issue of International Journal of Computer Applications (0975-8887) on International Conference on Electronics, Communication and Information Systems (ICECI 12), Nov. 2012, pp. 22-27.

Mou, Z. J. and P. Duhamel, "A Unified Approach to the Fast FIR Filtering Algorithms," 1988 IEEE, pp. 1914-1917.

Pavithra, D. and M. Ashok Kumar, "A Novel Fast FIR Algorithm for Area-Efficient Parallel FIR Digital Filter Structures Utilizes Symmetric Convolutions," IOSR Journal of VLSI and Signal Processing (IOSR-JVSP), vol. 4, Issue II Ver. II (Jan. 2014), pp. 39-46.

Wang, D. et al., "Block Fast FIR Algorithm and Circuit Design," Journal of Physics: Conference Series, 1827 (2021) 012004, pp. 1-10. doi: 10.1088/I 742-6596/1827/1/012004.

* cited by examiner

DIGITAL FILTER CIRCUIT HAVING PLURAL FIR FILTER CIRCUITS BASED ON PREDEFINED FILTER PARALLELISMS

FIELD OF THE DISCLOSURE

Embodiments of the present disclosure generally relate to digital filter circuits.

BACKGROUND

Digital filters are known in a large variety in the state of the art. In general, digital filters are configured to process a digital signal, thereby altering the digital signal in a predefined manner depending on the filter coefficients of the digital filter.

With the data rates in many different applications, for example in signal analysis and signal generation, becoming higher and higher, the demands on the digital filters are on the rise as well.

In order to increase the efficiency of digital filters, it is usually desirable to reduce the filter lengths of the digital filters. However, reducing the filter lengths impairs the ability of the digital filters to process digital signals having a high data parallelism. Thus, there is a need for a digital filter circuit that is able to process digital signals having a high data parallelism in a resource-efficient manner.

SUMMARY

Embodiments of the present disclosure relate to digital filter circuits. In an embodiment, the digital filter circuit comprises a digital filter input, at least two finite impulse response (FIR) filter circuits, and a connection circuit. The digital filter input is configured to receive a digital input signal set having a data parallelism. The at least two FIR filter circuits are configured to process the digital input signal set at least partially. The at least two FIR filter circuits comprise a pre-adder sub-circuit, a convolution sub-circuit, and a post-adder sub-circuit, respectively. The connection circuit is configured to selectively connect the at least two FIR filter circuits based on the data parallelism of the digital input signal set.

In the context of the present disclosure, a signal set is understood to denote a single signal or a plurality of signals, wherein the number of signals comprised in the signal set corresponds to the number of channels of the signal set. Accordingly, the term “process a signal set” is understood to denote that each signal comprised in the respective signal set is processed.

In general, the digital input signal set may be a 1×m signal, wherein 1 is a number of channels and m is a data parallelism of the digital input signal set. Thus, 1 denotes the number of active channels, i.e., the number of signals that are processed in parallel by an electronic component upstream of the digital filter circuit. Further, m denotes the number of data points or samples per time interval, for example the number of data points or samples per clock cycle. Accordingly, m denotes the number of samples of the respective signal that are processed in parallel (in each channel) by an electronic component upstream of the digital filter circuit.

In some embodiments, 1 may be a power of 2, i.e. $1=2^{L_{in}}$, with $L_{in}$ being an integer that is greater than or equal to 0. In some embodiments, 1 may be equal to 1, 2, 4, or 8. However, 1 may also be an integer greater than 8. For example, 1 may be equal to 16, such that up to 16 signal channels are provided.

Moreover, m may be a power of 2, i.e. $m=2^{M_{in}}$, with $M_{in}$ being an integer that is greater than or equal to 0. In some embodiments, m may be equal to 1, 2, 4, 8, 16, 32, 64, or 128. However, m may also be an integer greater than 128.

In some embodiments, the sum of the integers $L_{in}$ and $M_{in}$ may be constant. In other words, $L_{in}$ and $M_{in}$ may be subject to the constraint $L_{in}+M_{in}=C_{in}$, with $C_{in}$ being an integer and being constant. Hence, $L_{in}$ and $M_{in}$ can be selected with the constraint that their sum is always the same, e.g. the constant value C.

The digital filter circuit according to the present disclosure is based on the idea to selectively combine two or more FIR filter circuits for processing the digital input signal set at least if the data parallelism of the digital input signal set exceeds a predefined threshold. In some embodiments, the connection circuit selectively connects two or more of the at least two FIR filter circuits such that the digital input signal set is processed by each of the connected FIR filter circuits at least partially.

In other words, the digital filter circuit according to the present disclosure is configured to distribute different portions of the digital input signal set to be processed to different FIR filter circuits. In some embodiments, the digital filter circuit according to the present disclosure is configured to distribute different portions of an individual digital input signal of the digital input signal set to different FIR filter circuits such that the same individual digital input signal is processed by the at least two FIR filter circuits.

This way, the at least two FIR filters cooperate in processing the digital input signal set such that the digital input signal set can be appropriately processed even if the data parallelism of the digital input signal set is higher than what could be appropriately processed by a single FIR filter circuit.

Thus, the filter lengths of the at least two FIR filter circuits can be reduced without impairing the ability of the digital filter circuit to process digital input signals or digital input signal sets having a high data parallelism.

In some embodiments, the connection circuit may be configured to selectively connect the pre-adder sub-circuits of the at least two FIR filter circuits. Alternatively or additionally, the connection circuit may be configured to selectively connect the post-adder sub-circuits of the at least two FIR filter circuits.

In some embodiments, the digital filter circuit may be implemented in hardware at least partially, and in some embodiments, completely. For example, the pre-adder sub-circuits, the convolution sub-circuits, the post-adder sub-circuits and/or the connection circuit may comprise one or several ASICs and/or FPGAs that are configured to perform the functionality described in the present disclosure. Accordingly, the digital filter circuit can process the digital input signal set at a particularly high data rate due to the implementation of the digital filter circuit in hardware.

According to an aspect of the present disclosure, the connection circuit comprises at least one multiplexer sub-circuit. The at least one multiplexer sub-circuit may be configured to selectively connect the at least two FIR filter circuits based on the data parallelism of the digital input signal set. In some embodiments, the multiplexer sub-circuit may be configured to selectively forward different portions of the digital input signal set and/or different portions of an individual digital input signal of the digital input signal set to the at least two FIR filter circuits.

According to another aspect of the present disclosure, the at least two FIR filter circuits have a predefined filter parallelism, respectively. Therein and in the following, the term “filter parallelism” is understood to denote the number of samples that can be processed by the respective filter circuit simultaneously. Accordingly, the filter parallelism may depend on the filter length. Thus, the higher the filter length is, the more samples or symbols can be processed by the respective FIR filter circuit at the same time.

In an embodiment of the present disclosure, there are at least two digital input signal sets with different data parallelism, wherein the data parallelism of at least one digital input signal set of the at least two digital input signal sets is greater than the predefined filter parallelism or smaller than the predefined filter parallelism. In some embodiments, the predefined filter parallelism is not equal (unequal) to at least one data parallelism of the at least two digital input signal sets.

In other words, the predefined filter parallelism may match the data parallelism of one or more of the at least two digital input signal sets, but the predefined filter parallelism is different from the data parallelism of at least one of the at least two digital input signal sets.

In a further embodiment of the present disclosure, at least one of the at least two FIR filter circuits is configured to process the digital input signal set in a time multiplexing mode if the respective predefined filter parallelism is bigger than the data parallelism of the at least one digital input signal set. Alternatively or additionally, the at least two FIR filter circuits are configured to jointly process the digital input signal set if the respective predefined filter parallelism is smaller than the data parallelism of the at least one digital input signal set.

The digital filter circuit may comprise a control circuit, wherein the control circuit is configured to control the at least two FIR filter circuits and the connection circuit, such that the at least one of the at least two FIR filter circuits is configured to process the digital input signal set in a time multiplexing mode if the respective predefined filter parallelism is bigger than the data parallelism of the digital input signal set.

Alternatively or additionally, the control circuit may be configured to control the at least two FIR filter circuits and the connection circuit, such that the at least two FIR filter circuits are configured to jointly process the digital input signal set if the respective predefined filter parallelism is smaller than the data parallelism of the digital input signal set.

Accordingly, the digital filter circuit according to some embodiments of the present disclosure may have at least two different operational modes.

A first one of these two different operational modes, namely the time multiplexing mode, may be active if the predefined filter parallelism is bigger than the data parallelism of the digital input signal set. In the time multiplexing mode, one or several of the at least two FIR filter circuits may consecutively receive and process different individual digital input signals of the digital input signal set. Accordingly, in the time multiplexing mode, the digital filter circuit may be configured to process more individual digital input signals than there are FIR filter circuits.

A second one of these two different operational modes of the digital filter circuit may be active if the predefined filter parallelism is smaller than the data parallelism of the digital input signal set. In this second operational mode, the at least two FIR filter circuits cooperate in processing the digital input signal set, for example the individual digital input signals of the digital input signal set, as already described above.

According to an aspect of the present disclosure, the connection circuit is configured to selectively connect the at least two FIR filter circuits based on the predefined filter parallelisms of the at least two FIR filter circuits. In some embodiments, the connection circuit may be configured to connect the at least two FIR filter circuits if the data parallelism of the digital input signal set is bigger than the predefined filter parallelism of at least two FIR filter circuits. The connection circuit may be configured to disconnect the at least two FIR filter circuits from each other if the data parallelism of the digital input signal set is smaller than or equal to the predefined filter parallelism of the at least two FIR filter circuits.

In an embodiment of the present disclosure, the at least two FIR filter circuits comprise a short-length FIR filter, respectively. Short-length FIR filters allow for a particularly resource-efficient implementation of the digital filter circuit, for example for a hardware-efficient implementation of the digital filter circuit.

Therein and in the following, the term short-length FIR filter may denote an FIR filter with a filter length that is smaller than or equal to 256, for example smaller than or equal to 128, for example smaller than or equal to 64, for example smaller than or equal to 32. However, it is also conceivable that the filter length is greater than 256.

More details on the possible implementation of short-length FIR filters are given in “Short-Length FIR Filters and Their Use in Fast Nonrecursive Filtering”, IEEE TRANSACTIONS ON SIGNAL PROCESSING, Vol 39, NO. 6, JUNE 1991, the disclosure of which is incorporated by reference in its entirety.

According to a further aspect of the present disclosure, a combined structure of the pre-adder sub-circuit, of the convolution sub-circuit, and of the post-adder sub-circuit resembles a matrix decomposition. In general, by resembling the structure of a suitable matrix decomposition, the number of multiplier circuits that are necessary per FIR filter circuit can be reduced, thereby enhancing the hardware-efficiency and the cost-efficiency of the digital filter circuit.

In some embodiments, by configuring the combined structure of the pre-adder sub-circuit, of the convolution sub-circuit, and of the post-adder sub-circuit to resemble the matrix decomposition, the number of multiplier circuits that are necessary can be reduced, albeit in exchange for an increased number of adder circuits. However, this overall enhances the hardware-efficiency and the cost-efficiency of the digital filter circuit.

In a further embodiment of the present disclosure, the matrix decomposition corresponds to a Coppersmith-Winograd decomposition. The Coppersmith-Winograd decomposition, also known as the Coppersmith-Winograd algorithm, provides a particularly large reduction of the numerical complexity of matrix multiplications. Accordingly, if the combined structure of the pre-adder sub-circuit, of the convolution sub-circuit, and of the post-adder sub-circuit resembles the Coppersmith-Winograd matrix decomposition, an enhanced hardware-efficiency and cost-efficiency of the digital filter circuit is obtained.

If the combined structure of the pre-adder sub-circuit, of the convolution sub-circuit, and of the post-adder sub-circuit resembles a matrix decomposition, the connection circuit may be configured to selectively connect the post-adder sub-circuits of the at least two FIR filter circuits.

According to another aspect of the present disclosure, the matrix decomposition corresponds to a transposed matrix decomposition. In this embodiment of the present disclosure, time-overlapping of the samples of the digital input signal set is moved from the post-adder sub-circuit to the pre-adder sub-circuit. This means that a certain portion of the adder circuits of the post-adder sub-circuit is moved to the pre-adder sub-circuit compared to the case where the combined structure corresponds to a usual matrix composition. This way, the necessary memory-resources can be reduced, for example due to different word-width requirements in the pre-adder sub-circuit and in the post-adder sub-circuit.

If the combined structure of the pre-adder sub-circuit, of the convolution sub-circuit, and of the post-adder sub-circuit resembles a transposed matrix decomposition, the connection circuit may be configured to selectively connect the pre-adder sub-circuits of the at least two FIR filter circuits.

In some embodiments, the at least two FIR filter circuits are arranged in parallel. Accordingly, the individual digital input signals of the digital input signal set may be selectively forwarded to the at least two FIR filter circuits that are arranged in parallel, such that different digital input signals are simultaneously processed by different FIR filter circuits.

However, the at least two FIR filter circuits can additionally be selectively connected by the connection circuit if required by the data parallelism of the digital input signal set, as described above.

According to an aspect of the present disclosure, the pre-adder sub-circuit is free of multiplier circuits. Thus, the pre-adder sub-circuit may only comprise adder-circuits.

In an embodiment of the present disclosure, the post-adder sub-circuit is free of multiplier circuits. Thus, the post-adder sub-circuit may only comprise adder-circuits.

Accordingly, the convolution sub-circuit may be free of adder circuits and may comprise multiplier circuits only. However, it is also conceivable that the convolution sub-circuit may comprise adder circuits.

In other words, the convolution sub-circuit may be an N-tap filter with N=1. However, the convolution sub-circuit may be an N-tap filter with N being an integer greater than 1.

A parallelism of the digital filter circuit may be adjustable. In other words, the digital filter circuit may have several different operational modes that are associated with different data parallelisms such that the digital input signal set is processed appropriately.

The digital filter circuit may be controlled by another electronic component to adjust the parallelism. For example, if the digital filter circuit is part of a measurement instrument or of a signal generator, a control circuit of the measurement instrument or of the signal generator may control the digital filter circuit to adjust the parallelism. Thus, the parallelism of the digital filter circuit can be adapted to meet specific requirements In some embodiments, the parallelism of the digital filter circuit may be adjustable based on a user input, such that a user can set the wanted parallelism of the digital filter circuit.

According to a further aspect of the present disclosure, the parallelism of the digital filter circuit is adjustable on the fly. In other words, the parallelism of the digital filter circuit may be adjustable during operation of the digital filter circuit. Thus, the parallelism of the digital filter circuit can be adapted to meet specific requirements even while the digital input signal set is processed.

In a further embodiment of the present disclosure, the parallelism of the digital filter circuit is greater than or equal to 8, and/or wherein the parallelism of the digital filter circuit is smaller than or equal to 256. Thus, a variety of different parallelisms is available, such that different requirements for processing the digital input signal set can be met.

However, it is also conceivable that the parallelism of the digital filter circuit is greater than 256.

In some embodiments, the parallelism of the digital filter circuit may be coupled with the number of channels of the digital input signal set, as already described above. Accordingly, the digital filter circuit may have different operational modes that allow for processing a larger number of channels with a reduced data parallelism, or processing a reduced number of channels with an increased data parallelism, respectively. According to an aspect of the present disclosure, the at least two FIR filter circuits are configured for block-wise processing of samples. In some embodiments, each of the at least two FIR filter circuits may be configured to process $2^N$ samples or symbols simultaneously. For example, each of the at least two FIR filter circuits may be configured to process 2, 4, 8, 16, 32, 64, 128, 256, or more samples simultaneously.

In an embodiment of the present disclosure, the digital filter circuit comprises a sample history memory, wherein the sample history memory is configured to accumulate a predefined number of samples. The predefined number of samples may be the same as the number of samples that can be processed by the FIR filters simultaneously.

The sample history memory may be configured to accumulate the predefined number of samples, thereby obtaining a block of samples, and to forward the block of samples to at least one of the at least two FIR filter circuits. In some embodiments, the sample history memory may be configured to selectively forward the accumulated block of samples or several accumulated blocks of samples to the at least two FIR filter circuits.

In a further embodiment of the present disclosure, the sample history memory is configured to selectively forward the accumulated samples to the at least two FIR filter circuits. The sample history memory may selectively forward the accumulated samples to the at least two filter circuits such that the digital input signal set is processed at an optimal speed based on the parallelism of the digital input signal set, based on the number of channels of the digital input signal set, based on the filter parallelisms of the at least two FIR filter circuits, and/or based on the number of available FIR filter circuits. Thus, an optimal processing of the digital input signal set is guaranteed.

According to another aspect of the present disclosure, the digital filter circuit comprises at least two delay sub-circuits. The at least two delay sub-circuits may be configured to delay accumulated blocks of samples associated with the digital input signal set such that different channels of the digital input signal set can be consecutively processed by the same FIR filter circuit. Thus, the digital input signal set can be appropriately processed in a time multiplexing mode of the digital filter circuit.

If the data parallelism of the digital input signal set is greater than the predefined parallelisms of the at least two FIR filter circuits, one, several or all of the at least two delay sub-circuits may be deactivated.

The pre-adder sub-circuit may comprise the at least two delay sub-circuits. In some embodiments, the pre-adder sub-circuit may comprise the at least two delay sub-circuits if the combined structure of the pre-adder sub-circuit, of the convolution sub-circuit, and of the post-adder sub-circuit resembles a transposed matrix decomposition.

Alternatively, the post-adder sub-circuit may comprise the at least two delay sub-circuits. In some embodiments, the post-adder sub-circuit may comprise the at least two delay sub-circuits if the combined structure of the pre-adder sub-circuit, of the convolution sub-circuit, and of the post-adder sub-circuit resembles a matrix decomposition.

The number n of active delay sub-circuits may depend on the parallelism P of the digital input signal set and on the predefined parallelisms B of the at least two FIR filter circuits.

In some embodiments, the number n of active delay sub-circuits may be determined based on the equation $B=2^nP$.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed. Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

Figure 1:
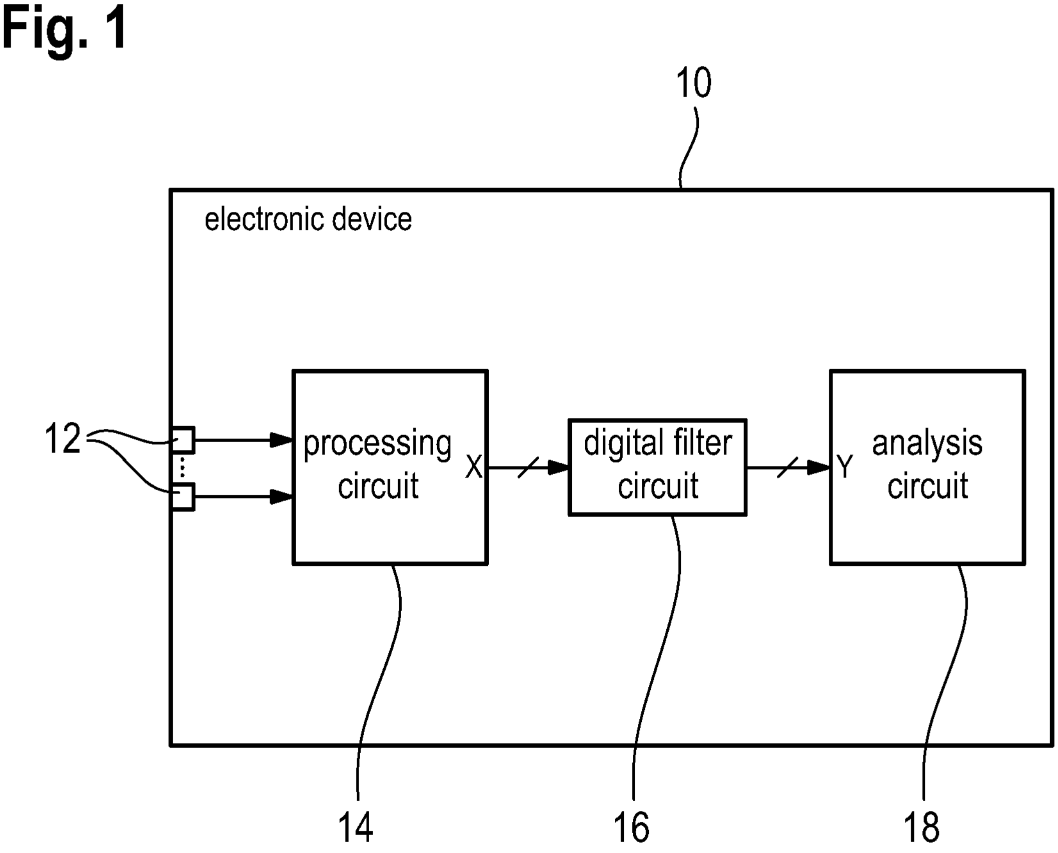
FIG. 1 schematically shows an electronic device comprising a digital filter circuit according to an embodiment of the present disclosure.

FIG. 1 schematically shows an electronic device 10. In general, the electronic device 10 may be any type of electronic device that is configured to process a digital signal. For example, the electronic device 10 may be a measurement instrument, such as a digital oscilloscope, a signal analyzer or a spectrum analyzer. As further examples, the electronic device 10 may be a signal generator or an electronic component of a radio system.

In the embodiment shown in FIG. 1, the electronic device 10 may be established as a measurement instrument. Without restriction of generality, the representative case of the electronic device 10 being a measurement instrument is described in the following.

The electronic device 10 comprises a plurality of signal inputs 12, a processing circuit 14, a digital filter circuit 16, and an analysis circuit 18. The plurality of signal inputs 12 are configured to receive at least one input signal, wherein the at least one input signal may comprise one or several analog input signals and/or one or several digital input signals.

In general, the number of signal inputs 12 corresponds to the maximum number of input signals that can be received simultaneously, i.e., the number of signal inputs 12 corresponds to the number of channels j of the electronic device 10. The number of channels j may be any integer bigger than zero. For example, the number of channels j may be equal to 1, 2, 4, 8, or 16. However, it is also conceivable that the number of channels j may be greater than 16. Moreover, the number of channels j may be a power of 2. However, the number of channels may also be any other integer, for example any odd integer.

The processing circuit 14 processes the plurality of input signals, thereby generating a set of digital signals X. For example, the processing circuit 14 may digitize analog input signals of the at least one input signal. Accordingly, the processing circuit 14 may comprise at least one analog-to-digital converter that is configured to digitize analog input signals. Additionally or alternatively, the processing circuit may (pre-)process the plurality of input signals in any other suitable way.

The set of digital signals X is filtered by the digital filter circuit 16, thereby generating a digital output signal set Y. In the following, the functionality of the digital filter circuit 16 is described in more detail. Accordingly, the set of digital signals X is denoted as "digital input signal set" X in the following.

The digital input signal set X is a 1×m signal, wherein 1 is a number of channels and m is a data parallelism of the digital input signal set X. Thus, 1 denotes the number of active channels, i.e. the number of signals that are processed in parallel by the processing circuit 14 upstream of the digital filter circuit 16.

Further, m denotes the number of data points or samples per time interval, for example the number of data points or samples per clock cycle. Accordingly, m denotes the number of samples of the respective signal that are processed in parallel (in each channel) by the processing circuit 14 upstream of the digital filter circuit.

In some embodiments, 1 may be a power of 2, i.e. $l=2^{L_{in}}$, with $L_{in}$ being an integer that is greater than or equal to 0. In some embodiments, 1 may be equal to 1, 2, 4, or 8. However, 1 may also be an integer greater than 8. For example, 1 may be equal to 16, such that up to 16 signal channels are provided. It is noted that 1 may, but does not have to be equal to the number j of signal inputs 12.

Moreover, m may be a power of 2, i.e. $m=2^{M_{in}}$, with $M_{in}$ being an integer that is greater than or equal to 0. In some embodiments, m may be equal to 1, 2, 4, 8, 16, 32, 64, or 128. However, m may also be an integer greater than 128.

In some embodiments, the sum of the integers $L_{in}$ and $M_{in}$ may be constant. In other words, $L_{in}$ and $M_{in}$ may be subject to the constraint $L_{in}+M_{in}=C_{in}$, with $C_{in}$ being an integer and being constant.

The digital output signal set Y may be a q×w signal, wherein q is a number of channels and w is a data parallelism of the digital output signal set Y. Therein, q may be equal to 1. However, q may also be different from 1. Moreover, w may be equal to m. However, w may also be different from m.

The digital output signal set Y may then be appropriately processed by the analysis circuit 18. For example, the digital output signal set Y may be saved, analyzed, post-processed and/or displayed on a display of the electronic device 10.

Figure 2:
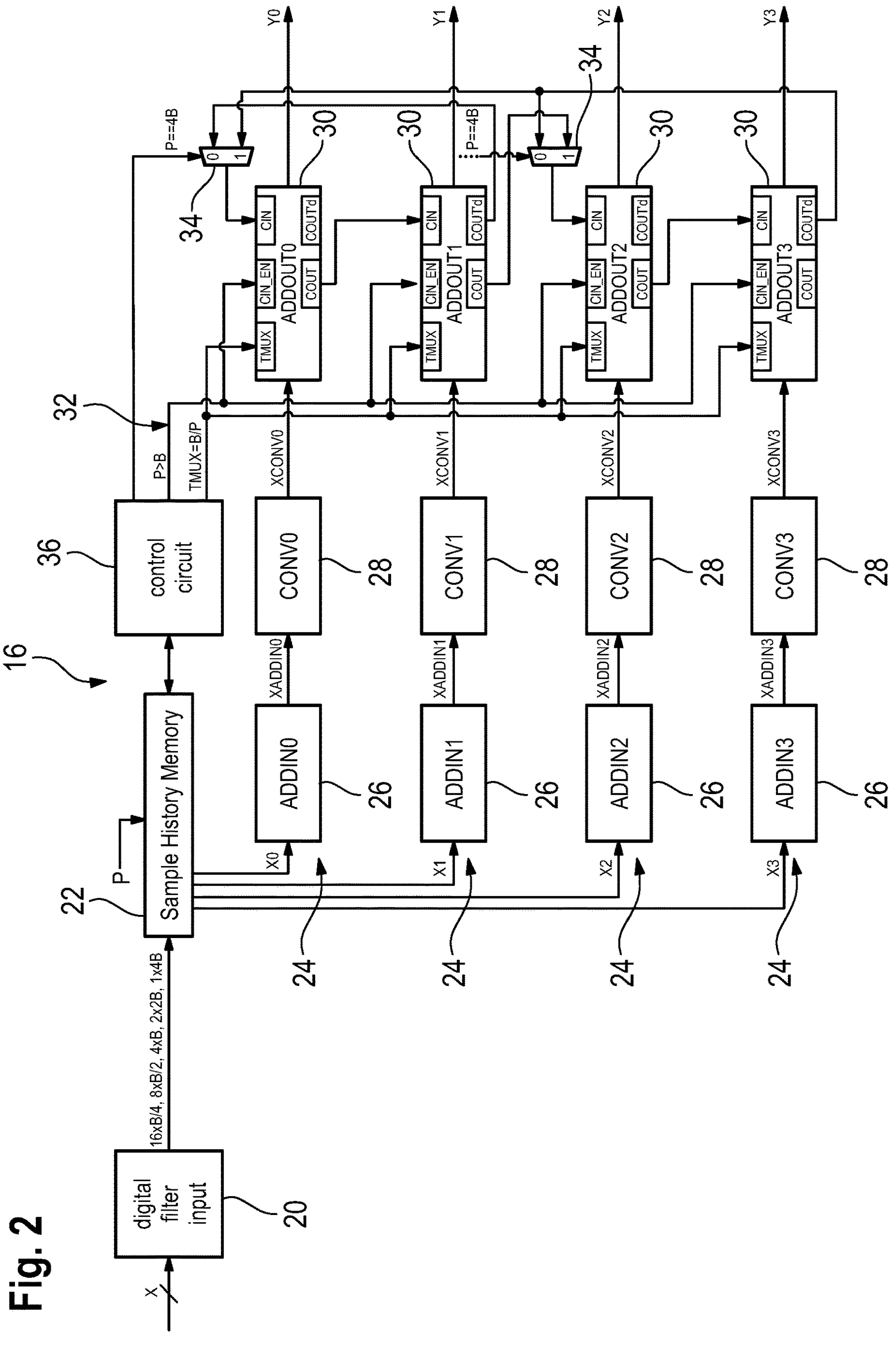
FIG. 2 schematically shows a digital filter circuit according to an embodiment of the present disclosure.

FIG. 2 shows a first embodiment of the digital filter circuit 16. The digital filter circuit 16 comprises a digital filter input 20, and a sample history memory 22 connected to the digital filter input 20 downstream of the digital filter input 20. The digital filter circuit 16 further comprises a plurality of finite impulse response (FIR) filter circuits 24.

Each FIR filter circuit 24 has a predefined filter length L. In general, the maximum number of samples that can be processed by the respective FIR filter circuit 24 simultaneously depends on the filter length L. Thus, the FIR filter circuits 24 have a predefined filter parallelism B, respectively. Therein and in the following, the term "filter parallelism" is understood to denote the number of samples that can be processed by the respective filter circuit simultaneously. Accordingly, the filter parallelism B may depend on the filter length L. Thus, the higher the filter length is, the more samples or symbols can be processed by the respective FIR filter circuit 24 at the same time.

In some embodiments, the FIR filter circuits 24 may be established as a short-length FIR filter, respectively. Therein and in the following, the term short-length FIR filter may denote an FIR filter with a filter length L that is smaller than or equal to 256, for example smaller than or equal to 128, for example smaller than or equal to 64, for example smaller than or equal to 32.

The FIR filter circuits 24 are arranged in parallel and are each connected to the sample history memory 22 downstream of the sample history memory 22. Without restriction of generality, an example embodiment of the digital filter circuit 16 is described in the following, wherein the digital filter circuit 16 comprises four FIR filter circuits 24. However, it is to be understood that the digital filter circuit 16 may comprise any other number of FIR filter circuits 24, for example 2, 8, or 16.

The FIR filter circuits 24 comprise a pre-adder sub-circuit 26 (labelled as "ADDIN #" in FIG. 2), a convolution sub-circuit 28 (labelled as "CONV #" in FIG. 2), and a post-adder sub-circuit 30 (labelled as "ADDOUT #" in FIG. 2), respectively. The digital filter circuit 16 further comprises a connection circuit 32 that comprises multiplexer sub-circuits 34. The connection circuit 32 or the multiplexer sub-circuits 34 are configured to selectively connect the FIR filter circuits 16 based on the data parallelism of the digital input signal set X, as will be described in more detail hereinafter.

In the embodiment shown in FIG. 1, a data signal output COUT of the post-adder sub-circuit 30 ADDOUT0 is connected with a data signal input CIN of the post-adder sub-circuit 30 ADDOUT1. Likewise, a data signal output COUT of the post-adder sub-circuit 30 ADDOUT2 is connected with a data signal input CIN of the post-adder sub-circuit 30 ADDOUT3. Moreover, data signal outputs COUT'd of the post-adder sub-circuits 30 ADDOUT1 and ADDOUT3 are connected with the multiplexer sub-circuits 34. Outputs of the multiplexer sub-circuits 34 are connected with the data signal inputs CIN of the post-adder sub-circuits 30 ADDOUT0 and ADDOUT2.

The digital filter circuit 16 is switchable between different operational modes by a control circuit 36, wherein each operational mode is associated with processing a predefined number of channels with a predefined parallelism.

In the embodiment shown in FIG. 2, the control circuit 36 is connected to the sample history memory 22 and to the connection circuit 32, for example to the multiplexer sub-circuits 34. For example, the control circuit is respectively connected to a multiplexer control input TMUX and to a connection control input CIN_EN of the post-adder sub-circuit 30 of the respective FIR filter circuit 24.

The control circuit 36 may be part of the digital filter circuit 16. However, the control circuit 36 may also be established separately from the digital filter circuit. For example, the control circuit 36 may be a general control circuit, for example a control unit of the electronic device 10.

In general, there are three different types of operational modes that depend on a relation between the data parallelism P=m of the digital input signal set X, and on the filter parallelism B of the FIR filter circuits 24.

If the data parallelism P is smaller than the filter parallelisms B of the FIR filter circuits 24, the digital filter circuit 16 is configured to be operated in a time multiplexing mode. In the time multiplexing mode, the digital filter circuit 16 may be configured to process more individual digital input signals than there are FIR filter circuits 24.

The sample history memory 22 accumulates blocks of samples of length B that are associated with the individual digital input signals of the digital input signal set X. The sample history memory 22 selectively forwards the accumulated blocks of samples to the FIR filter circuits 24.

In the embodiment shown in FIG. 2, there are two configurations for this operational mode, namely the 16×B/4 configuration and the 8×B/2 configuration. In the 16×B/4 configuration, each FIR filter circuit 24 consecutively processes four different digital input signals of the digital input signal set X in a time multiplexing mode, as the filter parallelism B is four times the data parallelism P=B/4 of the digital input signal set X. In the 8×B/2 configuration, each FIR filter circuits 24 consecutively processes two different digital input signals of the digital input signal set X in a time multiplexing mode, as the filter parallelism B is two times the data parallelism P=B/2 of the digital input signal set X.

Figure 3:
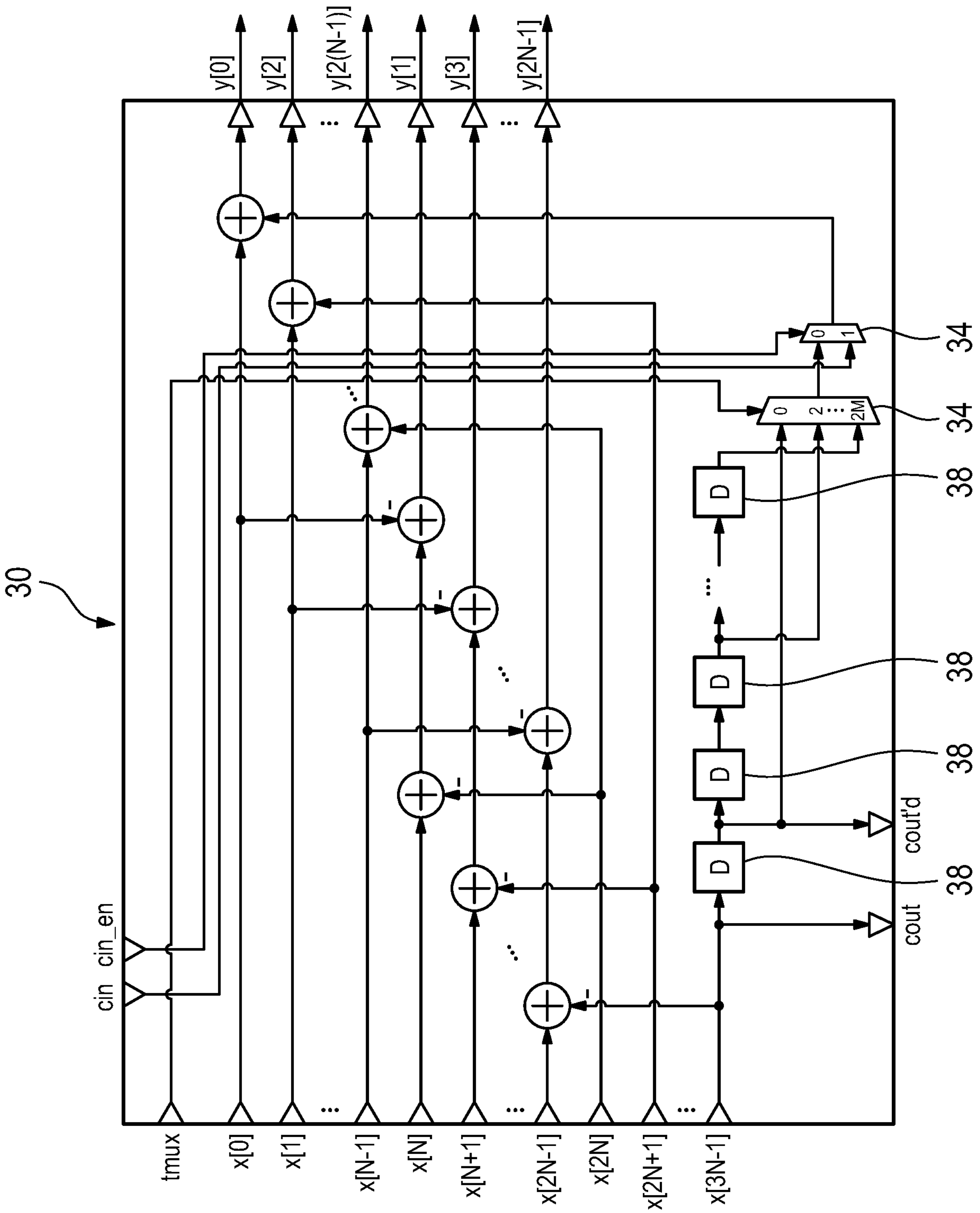
FIG. 3 schematically shows an example of a post-adder sub-circuit of the digital filter circuit of FIG. 2.

As is illustrated in FIG. 3, the digital filter circuit 16, for example the post-adder sub-circuits 30, may comprise at least two delay sub-circuits 38 that allow for the operation of the FIR filter circuits 24 in the time multiplexing mode. The at least two delay sub-circuits 38 may be configured to delay accumulated blocks of samples associated with the digital input signal set X such that different channels of the digital input signal set X can be consecutively processed by the same FIR filter circuit 24. Thus, the digital input signal set X can be appropriately processed in the time multiplexing mode of the digital filter circuit 16.

A second operational mode of the digital filter circuit 16 is activated if the predefined filter parallelism B is smaller than the data parallelism P of the digital input signal set X. In this operational mode, the FIR filter circuits 24, and in some embodiments the post-adder sub-circuits 30 are selectively connected by the connection circuit 32, such that the FIR filter circuits 24 cooperate in processing the digital input signal set X, for example the individual digital input signals of the digital input signal set.

In the embodiment shown in FIG. 2, there are two configurations for this operational mode, namely the 2×2B configuration and the 1×4B configuration. In the 2×2B configuration, two of the FIR filter circuit 24 cooperate in processing one of the digital input signals of the digital input signal set X, respectively, as the filter parallelism B is half of the data parallelism P=2B of the digital input signal set X. Accordingly, two digital input signals are processed by the four FIR filter circuits 24, wherein each digital input signal is jointly processed by two of the FIR filter circuits 24.

In the 1×4B configuration, all four FIR filter circuits 24 cooperate in processing a single digital input signal of the digital input signal set X, as the filter parallelism B is a quarter of the data parallelism P=4B of the digital input signal set X. Accordingly, a single digital input signal is jointly processed by the four FIR filter circuits 24.

In a third operational mode, the predefined filter parallelism B is equal to the data parallelism P of the digital input signals at X, i.e. it holds P=B. In this operational mode, each FIR filter circuit 24 processes one of the digital input signals of the digital input signal set X, respectively. In the embodiment shown in FIG. 2, this operational mode corresponds to the 4×B configuration.

Figure 4:
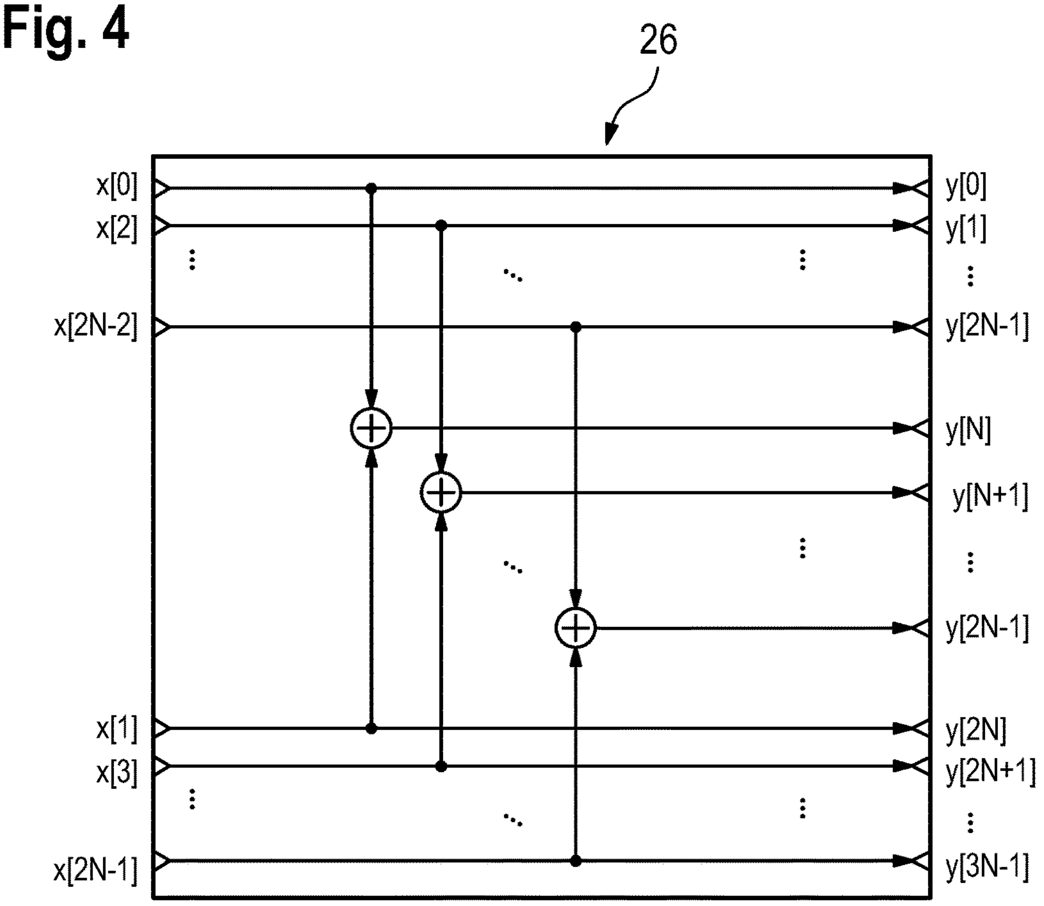
FIG. 4 schematically shows an example of pre-adder sub-circuit of the digital filter circuit of FIG. 2.

FIG. 4 schematically shows the pre-adder sub-circuit 26 of the digital filter circuit 16 of FIG. 2 in more detail. The structure of the pre-adder sub-circuit 26, of the convolution sub-circuit 28, and of the post-adder sub-circuit 30 of the digital filter circuit 16 of FIG. 2 is described in more detail below.

As already mentioned above, the FIR filter circuits 24 are each configured for block-wise processing of the digital input signal(s), as B samples are processed simultaneously by each of the FIR filter circuits 24.

In order to enhance the resource-efficiency of the digital filter circuit 16, a combined structure of the pre-adder sub-circuit 26, of the convolution sub-circuit 28, and of the post-adder sub-circuit 30 of each FIR filter circuit 24 of the digital filter circuit 16 shown in FIGS. 2 to 4 is configured to resemble a matrix decomposition.

For example, consider the case of a 2-tap filter. The output signal sample $Y_k$ relates to the input signal samples $X_k$ and $X_{k-1}$ as follows:

$$Y_k = H_0 \cdot X_k + H_1 \cdot X_{k-1}$$

Therein, $H_0$ and $H_1$ are the filter coefficients of the 2-tap filter. In case of an L-tap filter, there may be up to L different filter coefficients.

In terms of a block-wise processing of the input signal samples, this can be rewritten as follows:

$$\begin{bmatrix} Y_0 \\ Y_1 \end{bmatrix} = \begin{bmatrix} H_1 & H_0 & 0 \\ 0 & H_1 & H_0 \end{bmatrix} \cdot \begin{bmatrix} X_{-1} \\ X_0 \\ X_1 \end{bmatrix} = \begin{bmatrix} H_1 & H_0 & 0 \\ 0 & H_1 & H_0 \end{bmatrix} \cdot \begin{bmatrix} X_1 z^{-2} \\ X_0 \\ X_1 \end{bmatrix} = \begin{bmatrix} H_0 & z^{-2} H_1 \\ H_1 & H_0 \end{bmatrix} \cdot \begin{bmatrix} X_0 \\ X_1 \end{bmatrix} \tag{E.1}$$

The matrix on the right-hand side of equation (E.1) can be decomposed. For example, the Coppersmith-Winograd decomposition, also known as the Coppersmith-Winograd algorithm, may be used in order to decompose the matrix. This leads to the following result:

$$\begin{bmatrix} Y_0 \\ Y_1 \end{bmatrix} = \begin{bmatrix} 1 & 0 & z^{-2} \\ -1 & 1 & -1 \end{bmatrix} \cdot \begin{bmatrix} H_0 & 0 & 0 \\ 0 & H_0 + H_1 & 0 \\ 0 & 0 & H_1 \end{bmatrix} \cdot \begin{bmatrix} 1 & 0 \\ 1 & 1 \\ 0 & 1 \end{bmatrix} \cdot \begin{bmatrix} X_0 \\ X_1 \end{bmatrix} \tag{E.2}$$

In order to directly implement the right-hand side of equation (E.1) in hardware, two adder circuits and four multiplier circuits can be used. On the other hand, in order to implement the right-hand side of equation (E.2) in hardware, four adder circuits and three multiplier circuits are used. Thus, the number of multiplier circuits that employed in order to implement the respective filter in hardware is reduced, albeit at the cost of additional adder circuits.

Figure 5:
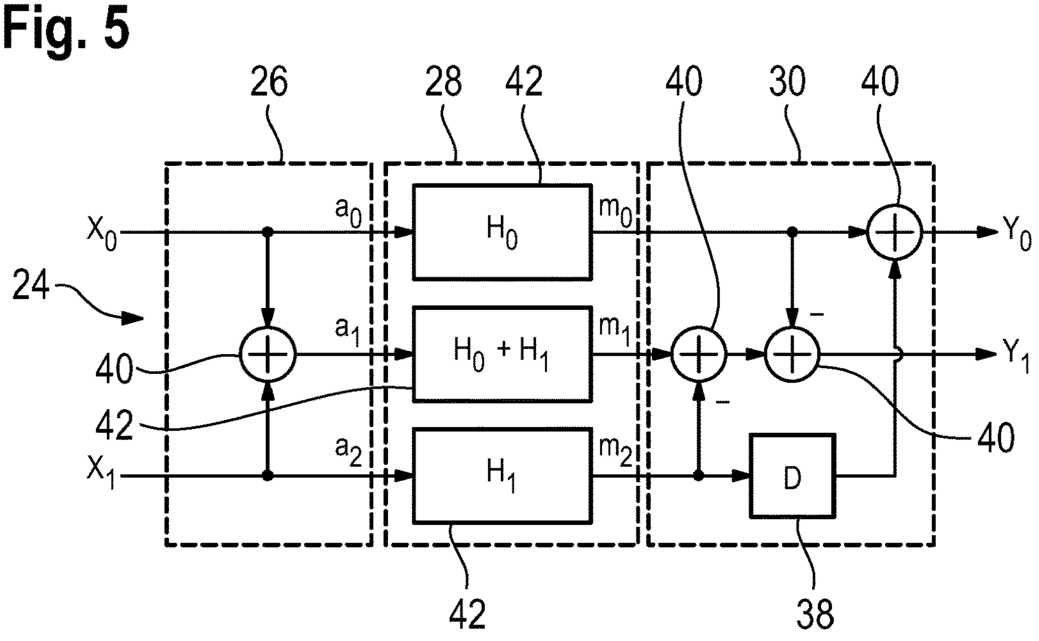
FIG. 5 schematically shows an example of a filter structure resembling a matrix decomposition.

FIG. 5 shows an implementation of equation (E.2) in hardware. In this embodiment, the pre-adder sub-circuit 26 only comprises adder circuits 40, for example one adder circuit 40 in this particular example. Thus, the pre-adder sub-circuit 26 can be free of multiplier circuits.

Likewise, the post-adder sub-circuit 30 in some embodiments only comprises adder circuits 40 and a delay sub-circuit 38. Thus, the post-adder sub-circuit 30 is free of multiplier circuits.

In some embodiments, the convolution sub-circuit 28 only comprises multiplier circuits 42. Thus, the convolution sub-circuit 28 is free of adder circuits.

The example described above holds for B=2. However, this can directly be generalized to any B larger than 2 by performing the Coppersmith-Winograd decomposition for larger matrices, for example recursively.

The resulting structure of the post-adder sub-circuit 30 and of the pre-adder sub-circuit 26 is shown in FIGS. 3 and 4, respectively.

Figure 6:
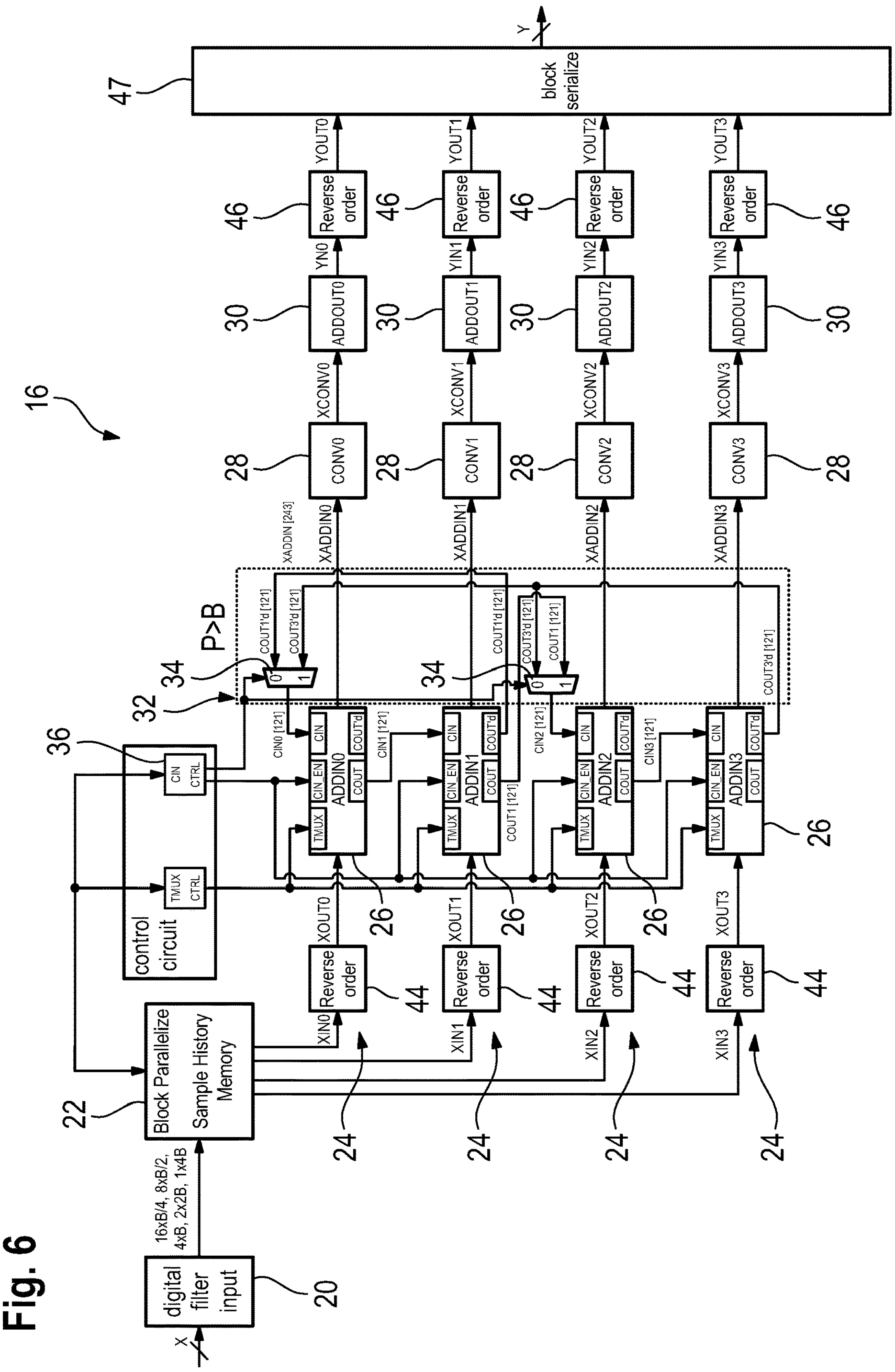
FIG. 6 schematically shows a second embodiment of a digital filter circuit according to the present disclosure.

FIG. 6 shows a second embodiment of the digital filter circuit 16, wherein only the differences compared to the first embodiment described above will be explained in the following. In the embodiment shown in FIG. 6, the connection circuit 32 is configured to selectively connect the pre-adder sub-circuits 26 of the FIR filter circuits 24. Thus, compared to the first embodiment described above, the connection circuit 32 is moved from the post-adder sub-circuits 30 to the pre-adder sub-circuits 26.

Moreover, each of the FIR filter circuits 24 comprises a first reversal sub-circuit 44 upstream, for example immediately upstream of the pre-adder sub-circuit 26. The first reversal sub-circuits 44 are configured to reverse the order of samples of the blocks of samples forwarded to the respective FIR filter circuit 24, such that the samples are forwarded to the pre-adder sub-circuits 26 in reversed order.

Each of the FIR filter circuits 24 further comprises a second reversal sub-circuit 46 downstream, for example immediately downstream of the post-adder sub-circuit 30. The second reversal sub-circuits 46 are configured to reverse the order of samples of the blocks of samples processed by the respective FIR filter circuit 24, such that the original order of the samples is restored.

The digital filter circuit 16 further comprises a serializer circuit 47. In general the serializer circuit 47 is configured to reverse the operation of the sample history memory 22, such that the output signal set Y is correctly reassembled from the blocks of samples processed by the individual FIR filter circuits 24.

It is noted that the first embodiment of the digital filter circuit 16 described above with respect to FIGS. 2 to 5 may also comprise a serializer circuit 47.

Figure 7:
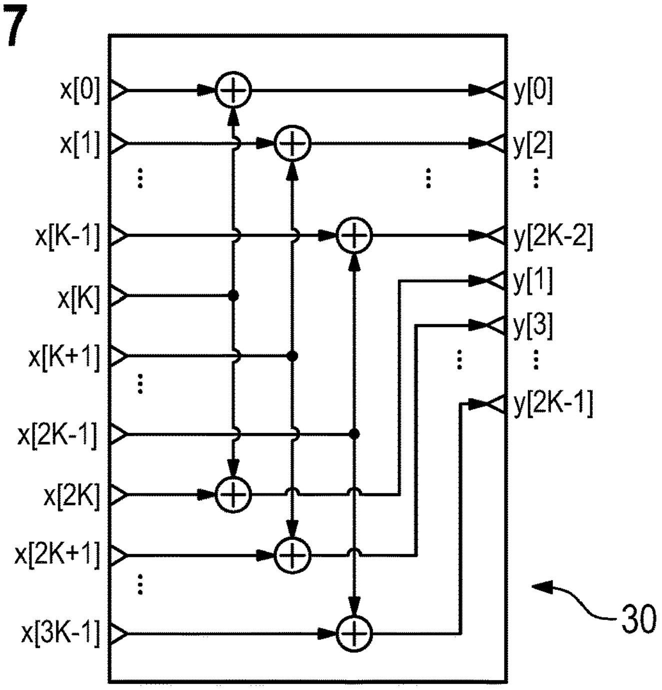
FIG. 7 schematically shows an example of a post-adder sub-circuit of the digital filter circuit of FIG. 6.

In general terms, in the embodiment depicted in FIG. 6, a combined structure of the pre-adder sub-circuit 26, of the convolution sub-circuit 28, and of the post-adder sub-circuit 30 of each FIR filter circuit 24 is configured to resemble a transposed matrix decomposition. The resulting structures of the post-adder sub-circuits 30 and of the pre-adder sub-circuits are shown in FIGS. 7 and 8, respectively.

Figure 8:
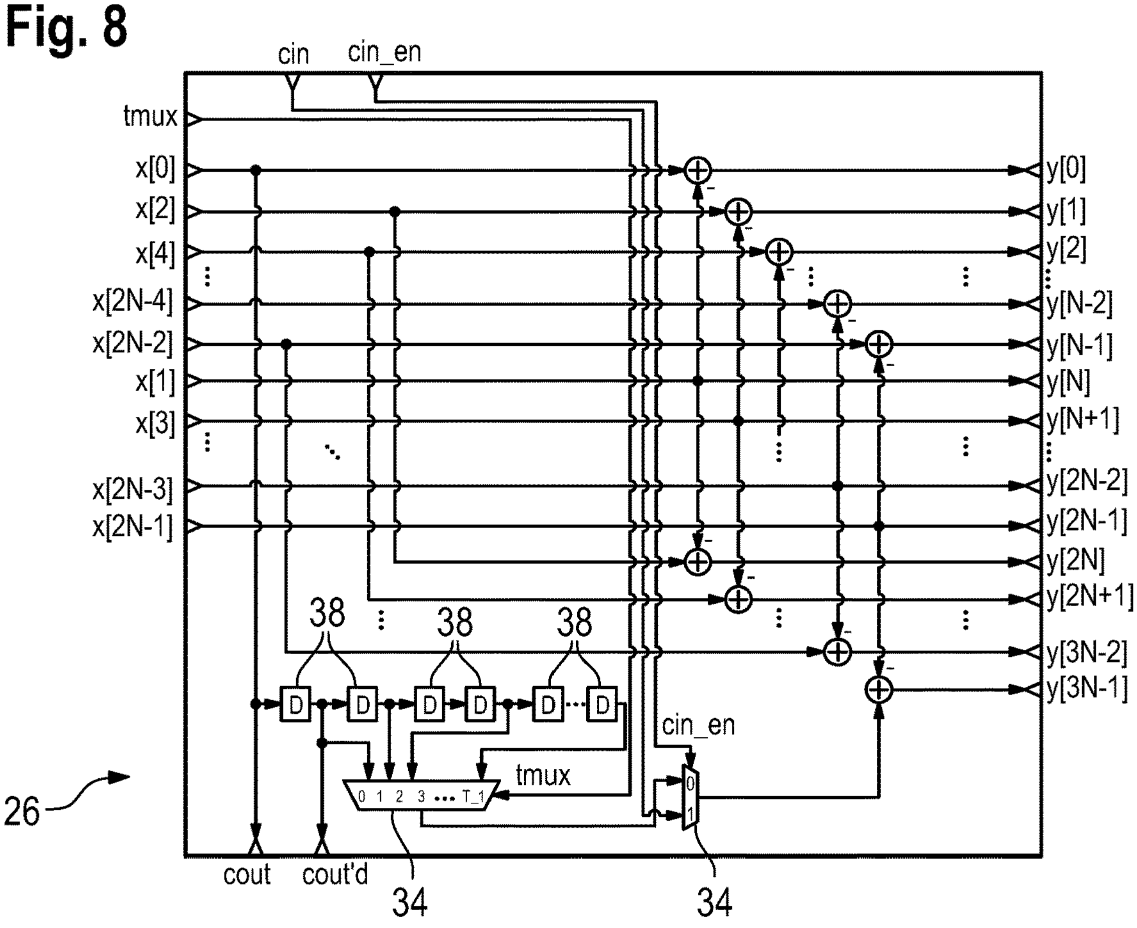
FIG. 8 schematically shows an example of a pre-adder sub-circuit of the digital filter circuit of FIG. 6.

As is depicted in FIG. 8, the delay sub-circuits 38 and the multiplexer sub-circuits 34 have been moved from the post-adder sub-circuits 30 to the pre-adder sub-circuits 26 compared to the first variant of the digital filter circuit 16 shown in FIGS. 2 to 4.

In order to derive the transposed matrix decomposition, equation (E.1) can be rewritten as $$Y = \hat{H} \cdot X = U^T U \cdot \hat{H} \cdot U U^T \cdot X \tag{E.3}$$

for any orthogonal matrix U.

Equation (E.1) can then be rewritten as $$Y = \overline{P}^T \overline{P} \cdot \hat{H} \cdot \overline{P}^T \overline{P} \cdot X = \overline{P}^T \hat{H}^T \overline{P} \cdot X = \overline{P}^T A^T \cdot D^T \cdot C^T \cdot \overline{P} \cdot X \tag{E.4}$$

with $$\overline{P} = \begin{bmatrix} 0 & \cdots & 1 \\ \vdots & \ddots & \vdots \\ 1 & \cdots & 0 \end{bmatrix} \tag{E.5}$$

Accordingly, equation (E.2) can be rewritten as $$\begin{bmatrix} Y_0 \\ Y_1 \end{bmatrix} = \begin{bmatrix} 1 & 0 & z^{-2} \\ -1 & 1 & -1 \end{bmatrix} \cdot \begin{bmatrix} H_0 & 0 & 0 \\ 0 & H_0 + H_1 & 0 \\ 0 & 0 & H_1 \end{bmatrix} \cdot \begin{bmatrix} 1 & 0 \\ 1 & 1 \\ 0 & 1 \end{bmatrix} \cdot \begin{bmatrix} X_0 \\ X_1 \end{bmatrix} = \tag{E.6}$$

$$\begin{bmatrix} 0 & 1 \\ 1 & 0 \end{bmatrix} \cdot \begin{bmatrix} 1 & 1 & 0 \\ 0 & 1 & 1 \end{bmatrix} \cdot \begin{bmatrix} H_0 & 0 & 0 \\ 0 & H_0 + H_1 & 0 \\ 0 & 0 & H_1 \end{bmatrix} \cdot \begin{bmatrix} 1 & -1 \\ 0 & 1 \\ z^{-2} & -1 \end{bmatrix} \cdot \begin{bmatrix} 0 & 1 \\ 1 & 0 \end{bmatrix} \cdot \begin{bmatrix} X_0 \\ X_1 \end{bmatrix}$$

The first and the last matrix in the second line of equation (E.6) are anti-diagonal matrices, which are implemented by the second reversal sub-circuit 46 and the first reversal sub-circuit 44, respectively.

Figure 9:
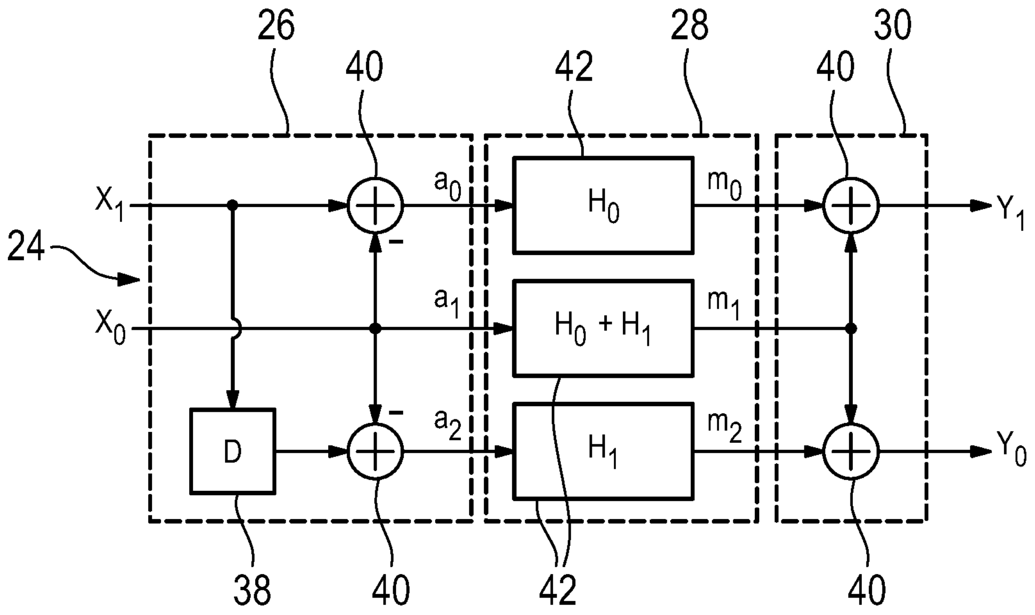
FIG. 9 schematically shows an example of a filter structure resembling a transposed matrix decomposition.

FIG. 9 shows an implementation of the remaining terms of equation (E.6) in hardware.

Compared to the variant shown in FIG. 5 (i.e., the "normal" matrix decomposition), the delay sub-circuit 38 and one of the adder circuits 40 has been moved from the post-adder sub-circuit 30 to the pre-adder sub-circuit 26.

The example described above holds for B=2. However, this can directly be generalized to any B larger than 2 by performing the transposed Coppersmith-Winograd decomposition for larger matrices.

The resulting structure of the post-adder sub-circuit 30 and of the pre-adder sub-circuit 26 is shown in FIGS. 7 and 8, respectively, as already described above.

It has turned out that the memory resources can be reduced if the structure of the FIR filter circuits 24 is configured to resemble a transposed matrix decomposition, analogously to equation (E.6) and FIGS. 6-9.

Certain embodiments disclosed herein utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof.

In an embodiment, circuitry includes hardware circuit implementations (e.g., implementations in analog circuitry, implementations in digital circuitry, and the like, and combinations thereof). In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

Throughout this specification, terms of art may be used. These terms are to take on their ordinary meaning in the art from which they come, unless specifically defined herein or the context of their use would clearly suggest otherwise.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A digital filter circuit, comprising:

a digital filter input configured to receive a digital input signal set having a data parallelism;

at least two finite impulse response (FIR) filter circuits configured to process the digital input signal set at least partially; and a connection circuit configured to selectively connect the at least two FIR filter circuits based on the data parallelism of the digital input signal set, wherein the at least two FIR filter circuits comprise a pre-adder sub-circuit, a convolution sub-circuit, and a post-adder sub-circuit, respectively, wherein the at least two FIR filter circuits have a predefined filter parallelism, respectively, wherein the connection circuit is configured to selectively connect the at least two FIR filter circuits based on the predefined filter parallelisms of the at least two FIR filter circuits, wherein the connection circuit is configured to connect the at least two FIR filter circuits if the data parallelism of the digital input signal set is bigger than the predefined filter parallelism of at least two FIR filter circuits, and wherein the connection circuit is configured to disconnect the at least two FIR filter circuits from each other if the data parallelism of the digital input signal set is smaller than or equal to the predefined filter parallelism of the at least two FIR filter circuits, wherein a combined structure of the pre-adder sub-circuit, of the convolution sub-circuit, and of the post-adder sub-circuit resembles a matrix decomposition or a transposed matrix decomposition, wherein the connection circuit is configured to selectively connect the post-adder sub-circuits of the at least two FIR filter circuits if said combined structure of the pre-adder sub-circuit, of the convolution sub-circuit, and of the post-adder sub-circuit resembles the matrix decomposition, and wherein the connection circuit is configured to selectively connect the pre-adder sub-circuits of the at least two FIR filter circuits if said combined structure of the pre-adder sub-circuit, of the convolution sub-circuit, and of the post-adder sub-circuit resembles the transposed matrix decomposition.

2. The digital filter circuit of claim 1, wherein the connection circuit comprises at least one multiplexer sub-circuit.

3. The digital filter circuit of claim 1, wherein there are at least two digital input signal sets with different data parallelism, wherein the data parallelism of at least one digital input signal set of the at least two digital input signal sets is greater than the predefined filter parallelism or smaller than the predefined filter parallelism.

4. The digital filter circuit of claim 3, wherein at least one of the at least two FIR filter circuits is configured to process the digital input signal set in a time multiplexing mode if the respective predefined filter parallelism is bigger than the data parallelism of the at least one digital input signal set, and/or wherein the at least two FIR filter circuits are configured to jointly process the digital input signal set if the respective predefined filter parallelism is smaller than the data parallelism of the at least one digital input signal set.

5. The digital filter circuit of claim 1, wherein the at least two FIR filter circuits comprise a short-length FIR filter, respectively.

6. The digital filter circuit of claim 1, wherein the matrix decomposition corresponds to a Coppersmith-Winograd decomposition.

7. The digital filter circuit of claim 1, wherein the at least two FIR filter circuits are arranged in parallel.

8. The digital filter circuit of claim 1, wherein the pre-adder sub-circuit is free of multiplier circuits.

9. The digital filter circuit of claim 1, wherein the post-adder sub-circuit is free of multiplier circuits.

10. The digital filter circuit of claim 1, wherein a parallelism of the digital filter circuit is adjustable.

11. The digital filter circuit of claim 10, wherein the parallelism of the digital filter circuit is adjustable on the fly.

12. The digital filter circuit of claim 10, wherein the parallelism of the digital filter circuit is greater than or equal to 8, and/or wherein the parallelism of the digital filter circuit is smaller than or equal to 256.

13. The digital filter circuit of claim 1, wherein the at least two FIR filter circuits are configured for block-wise processing of samples.

14. The digital filter circuit of claim 1, wherein the digital filter circuit comprises a sample history memory, wherein the sample history memory is configured to accumulate a predefined number of samples.

15. The digital filter circuit of claim 14, wherein the sample history memory is configured to selectively forward the accumulated samples to the at least two FIR filter circuits.

16. The digital filter circuit of claim 1, wherein the digital filter circuit comprises at least two delay sub-circuits.

17. A digital filter circuit, comprising:

a digital filter input configured to receive a digital input signal set having a data parallelism;

at least two finite impulse response (FIR) filter circuits configured to process the digital input signal set at least partially; and a connection circuit configured to selectively connect the at least two FIR filter circuits based on the data parallelism of the digital input signal set, wherein the at least two FIR filter circuits comprise a pre-adder sub-circuit, a convolution sub-circuit, and a post-adder sub-circuit, respectively, wherein the at least two FIR filter circuits have a predefined filter parallelism, respectively, wherein the connection circuit is configured to selectively connect the at least two FIR filter circuits based on the predefined filter parallelisms of the at least two FIR filter circuits, wherein the connection circuit is configured to connect the at least two FIR filter circuits if the data parallelism of the digital input signal set is bigger than the predefined filter parallelism of at least two FIR filter circuits, and wherein the connection circuit is configured to disconnect the at least two FIR filter circuits from each other if the data parallelism of the digital input signal set is smaller than or equal to the predefined filter parallelism of the at least two FIR filter circuits, and wherein the parallelism of the digital filter circuit is adjustable on the fly, wherein the parallelism of the digital filter circuit is adjustable during operation of the digital filter circuit.

* * * * *